United States Patent

[11] 3,611,046

[72] Inventor Paul W. Covert
Butler, Pa.
[21] Appl. No. 18,359
[22] Filed Jan. 24, 1969
[45] Patented Oct. 5, 1971
[73] Assignee Cross Electronics, Inc.
Wexford, Pa.
Continuation-in-part of application Ser. No. 580,097, Sept. 16, 1966, now abandoned.

[54] APPARATUS FOR MOUNTING AND-OR COOLING ELECTRICAL DEVICES

4 Claims, 8 Drawing Figs.

[52] U.S. Cl. .......... 317/100, 165/80, 317/234 A
[51] Int. Cl. .......... H01l 1/12
[50] Field of Search .......... 165/80; 317/100, 234 (1); 174/15, 16, DIG. 5

[56] References Cited

UNITED STATES PATENTS

| | | | |
|---|---|---|---|
| 3,209,062 | 9/1965 | Scholz | 174/15 |
| 3,229,757 | 1/1966 | Root | 165/80 |
| 3,261,396 | 7/1966 | Trunk | 165/80 |
| 3,275,921 | 9/1966 | Fellendorf | 165/80 |
| 3,377,524 | 4/1968 | Bock | 317/100 X |

FOREIGN PATENTS

| | | | |
|---|---|---|---|
| 659,585 | 3/1963 | Canada | 174/DIG. 5 |
| 1,389,182 | 11/1964 | France | 174/DIG. 5 |

*Primary Examiner*—Lewis H. Myers
*Assistant Examiner*—Gerald P. Tolin
*Attorney*—Don J. Smith

ABSTRACT: I disclose method and means for mounting and cooling a heat-producing electrical device and arranged such that a considerable quantity of heat can be conducted across an electrically isolating coating, although the unit heat transfer coefficient of the coating is relatively low. This is accomplished with mounting members associated with the device and having a relatively large area of the coating sandwiched therebetween. The dielectric strength is therefore improved, while the total heat transfer coefficient is improved to the extent that considerable heat can be transmitted from one mounting member to the other without large temperature differentials. Also disclosed are novel methods for coating and disposing the mounting members in optimum heat transfer arrangement. One of the mounting members, which may be in the form of a chassis or base structure, is provided with sufficient area that heat is convected and/or radiated therefrom without the use of bulky cooling fins or other convecting structures.

INVENTOR
Paul W. Covert.
BY
Buell Blenko & Ziesenheim
HIS ATTORNEYS

APPARATUS FOR MOUNTING AND-OR COOLING ELECTRICAL DEVICES

The present application is a continuation-in-part of my copending application, entitled "Method and Apparatus for Mounting and/or Cooling Electrical Devices," filed Sept. 16, 1966, Ser. No. 580,097, now abandoned.

My present invention relates to methods and means for mounting and electrically isolating electrical devices which might otherwise present shock hazards and for dissipation heat therefrom when so mounted, and more particularly to methods and means for mounting, electrically isolating, and cooling such devices, exemplified by magnetic amplifiers, resistors, transformers, power semiconductors such as silicon-controlled rectifiers, transistors, diodes, or threshold and other electrical devices in general which are damaged or whose characteristics may vary undesirably with increase in operating and ambient temperature.

In the use of electrical devices of the character described, it is frequently difficult to isolate electrically such devices without generous but expensive usage of insulated fasteners and other hardware. This problem is considerably aggravated, moreover, when at the same time provision must be made for the disposal of waste heat, either locally generated or ambient heat, from such devices to permit proper operation of the devices and to prevent damage thereto through overheating.

For example, when utilizing power or other waste heat-producing semiconductors, such as those mentioned above, one of the limiting design parameters is the heat generated at the anode-cathode and other junctions within the physical structure of the semiconductors. The heat that is thus generated must be dissipated through thermally conductive means, or a heat sink, which is in intimate or good thermal contact with the case or mounting stud of the semiconductor. However, thermal contact also entails electrical contact so that in conventional systems the heat sink member, which may be a series of thermally coupled copper or aluminum plates or a finned, extruded shape of a variety of configurations, is electrically connected to the power circuit and in some cases to the support or chassis therefor.

As a result the heat sink members, and the support or chassis when so connected, constitute a potential shock hazard to operating or maintenance personnel inadvertently contacting the same, when energized. Moreover, such conventional heat sink members are necessarily large and bulky, and therefore occupy a considerable space within the equipment where space is usually at a premium. Usually the finned heat sinks were insulated from the base structure and therefore required additional space and hardware. In order to conserve space the heat sink members and the electrical devices mounted thereon were frequently stacked with the result that access thereto for maintenance or replacement was difficult. Such crowding of the finned sink members also prevent proper dissipation of heat therefrom and limited access to adjacent circuit components mounted on the chassis or support. The use of finned heat sinks for this purpose resulted in bulky structures that were difficult to handle or store or assemble into compact equipment cabinets or the like.

The disadvantages of the prior art are most typically represented by the U.S. Pats. to Scholtz No. 3,209,062; Root et al. No. 3,229,757; and Trunk No. 3,261,396. The Trunk patent discloses a mounting deck for a transistor which is secured to a base of substantially similar area. The mounting deck is separated from the base by a thin layer of epoxy cement. This may be loaded with metal particles to improve heat transfer. The base instead may be anodized. It is doubtful that the proposed coatings would provide adequate electrical isolation in many applications. It is noteworthy that heat must be dissipated from both the deck and the base of the Trunk arrangement by a relatively large number of convecting fins secured thereon.

The Trunk arrangement, therefore, is essentially identical to the heat dissipator of Root et al. which uses a single mounting member and convecting fins secured to each side thereof. The Scholz arrangement, in turn, is similar to Root et al. with the exception that the convecting fins are replaced with a conduit system for circulating a refrigerant through the support member or chassis structure. Although the patentee states offhand that the electrical devices can be insulated from the base structure or chassis, auxiliary cooling means obviously are required to maintain a temperature differential for adequate flow of heat across a material of low thermal conductivity. Moreover, the base requires external conduit connections to a source of refrigerant fluid.

Also of interest are the U.S. Pats. to McAdam No. 2,964,688; Thorn No. 3,149,265; Fellendorf et al. No. 3,275,921 and Bruestle No. 3,200,296. In the McAdam patent the mounting plate for the transistors obviously is grounded to the wall or chassis structure. The McAdam transistors are electrically isolated from the transistor mounting plate by an electrically insulating coating on the finned dissipators which secure the mounting plate to the transistors. Some heat apparently is transferred from the heat dissipators to the mounting plate owing to the thinness of the film and its impregnation with finally divided molybdenum disulfide. The McAdam arrangement therefore operates by maintaining a film having a relatively high thermal conductance but small contact areas, in contrast to applicant's arrangement, as described below in greater detail, which utilizes a much more efficient electrically isolating coating with a small thermal conductance but large contact areas. It is doubtful moreover that the McAdam arrangement can dissipate significant quantities of heat or that relatively high potentials can be isolated. Further, the McAdam transistors each are electrically isolated from their common mounting plate, while my heat-producing device or devices are in electrical contact with their mounting plate to which suitable circuit means can be directly connected. The Thorn arrangement is adapted for dissipating relatively minor amounts of heat from a transistor or the like; there is no teaching in the Thorn patent of the transfer of relatively large quantities of heat across dielectric coatings or films having relatively poor heat transfer coefficients.

The Bruestle patent is similar to McAdam in that electrically insulating films have high unit thermal conductivity and have relatively small areas relied upon for heat transfer, rather, than large surface areas of films having low unit thermal conductivity and more reliable dielectric properties. The Fellendorf et al. patent is similar to Scholz in that a number of semiconductive diodes are separated by small insulators from a heat sink in the form of a fluid cooled conduit.

In general, the teachings of the prior art are diametrically opposed in my present invention. My invention provides methods and means for dissipating a large quantity of heat from electrically isolated devices despite poor thermal coefficients (but very good dielectric strengths). Moreover, my arrangement avoids the use of relatively large temperature differentials between the heat-producing devices and the heat sink in order to induce an adequate flow of heat across insulating coatings or the like interposed therebetween. Therefore, I can operate conventional heat-producing devices at considerably lower temperatures without the use of auxiliary convectors, cooling fins, refrigerant systems or the like. The prior art is directed to increasing thermal coefficients of various dielectric materials by various means to permit a relatively low level of heat dissipation, and this at the expense of deteriorating dielectric reliability. Unlike the prior art the method and means of my invention for cooling heat-producing devices is able to dissipate significant quantities of heat at relatively low temperature differentials.

I have solved these difficulties of the prior art by providing methods and means for effecting compact, electrically isolating mounting arrangements for electrical devices in general including power semiconductors and other heat-producing electrical devices and the like. Moreover, the mounting arrangement cooperates with the chassis base or other mounting panel or enclosure on which the aforementioned electric devices are mounted to form a heat sink therefore, but at the same time to electrically isolate the devices from the chassis or panel. I have also developed novel methods for the application of an electrically isolating coating to the assembly thus generally described.

When utilizing the equipment chassis, base or panel structure as a heat sink, as aforesaid, I provide a good thermally and electrically conductive mounting member, rather large in area, on which the heat-producing device is mounted. The mounting member is closely and contiguously fitted against a complementarily shaped and coextending portion of a chassis structure or base, which is usually an essential component of equipment in which the heat-producing device or devices are utilized.

In accord with my invention the chassis or base is arranged for dissipation of all waste heat conducted thereto without the use of auxiliary cooling means, such as convecting fins or refrigerant conduits.

A very thin film of electrically insulating material is placed between the heat sink portion and the mounting member to isolate electrically the heat sink from the mounting member, which is usually at the maximum potential applied to the device by virtue of the latter being thermally and electrically connected thereto. Although the electrically insulating film has a relatively low heat transfer coefficient, as is usually the case with electrically insulating materials, the heat dissipated from the device to the mounting member still is rapidly transferred across the electrical insulation between the mounting member and the chassis or base which serves as a heat sink.

Owing to the relatively large areas involved, the quantity of heat transferred per unit time is considerably large even though the electrical insulation is not an especially good thermal conductor and its unit heat transfer coefficient is relatively low. Such is the case even with the best of the electrical insulating coatings for this purpose, such as certain known epoxy resins and other plastic materials. Desirably, the entire chassis or base is provided on both sides with the insulating coating, so that the device or devices and their mounting plates are isolated from the chassis or base and the latter in turn is isolated from associated equipment.

I also provide, in furtherance of these aims, novel means for applying the aforementioned electrical insulation to the heat sink portion or to the mounting member and for physically securing these members together but in mutual, electrical isolation, to eliminate conventional insulating hardware and to simplify the fastening means required for this purpose. Such arrangement also facilitates assembly and maintenance of the equipment in which such electrical devices are employed by providing for easy insertion and removal thereof.

These and other objects, features and advantages of the invention together with structural details thereof, will be elaborated upon during the forthcoming description of certain presently preferred embodiments of the invention together with certain presently preferred methods of practicing the same.

In the accompanying drawings, I have shown certain presently preferred embodiments of the invention and have illustrated presently preferred methods of practicing the same, wherein.

Figures 1, 2, 3, 4, 5, 5A, 6, 7:
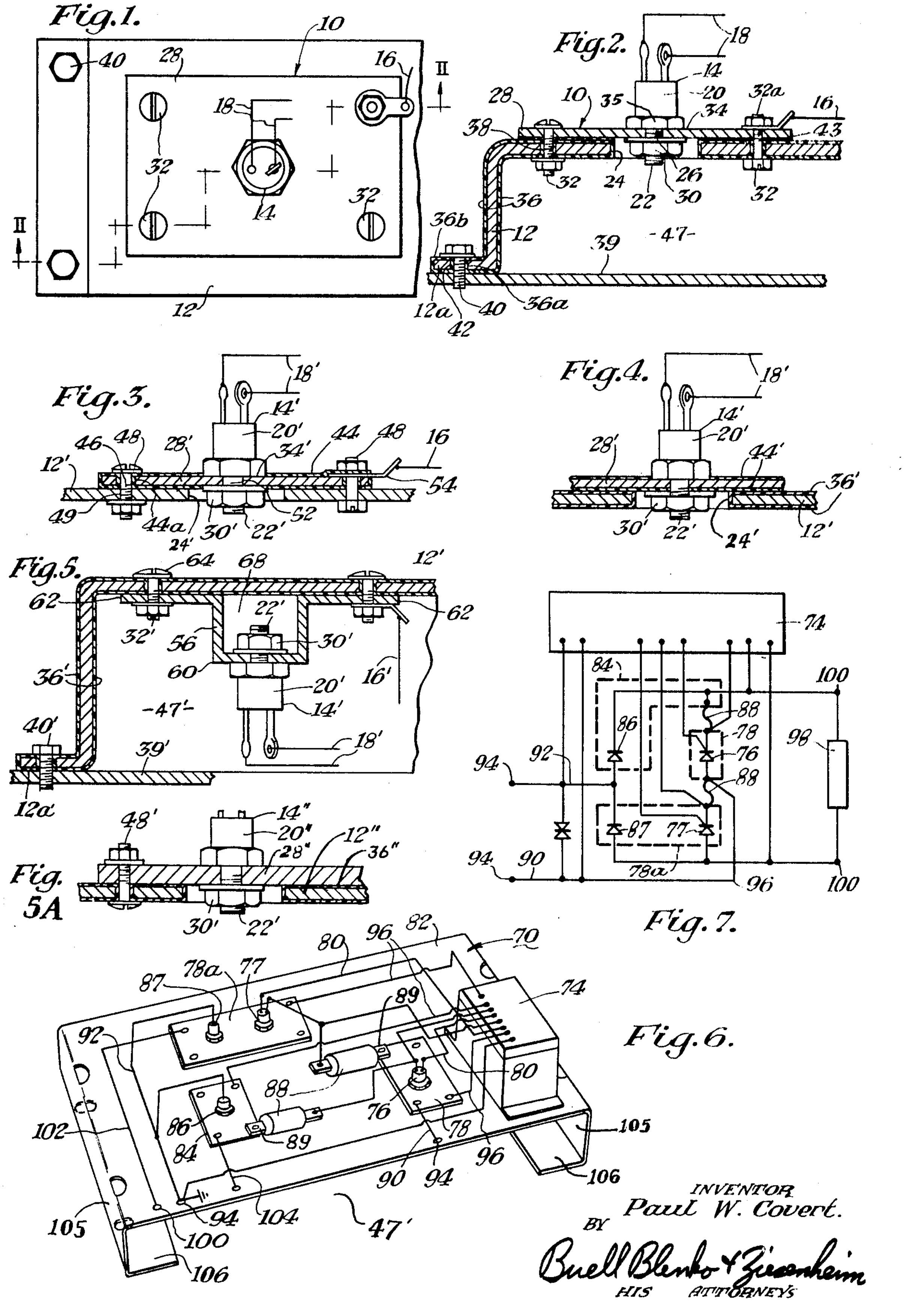
FIG. 1 is a bottom plan view of a heat sink such as a chassis structure, partially broken away, and showing one form of waste heat-producing mounting arrangement associated therewith.
FIG. 2 is a sectional view of the chassis and mounting arrangement illustrated in FIG. 1 and taken along reference line II—II thereof.

FIG, 3 is a partial, sectional view of another waste heat-producing mounting arranged according to my invention;

FIG. 4 is a partial, sectional view of still another form of mounting and waste heat-producing means arranged in accordance with the invention;

FIG. 5 is a partial, sectional view of yet another modification of the mounting and waste heat-producing means of my invention;

FIG. 5A is a partial, cross-sectional view of yet another modification of the mounting and waste heat-producing means of my invention;

FIG. 6 is an isometric view of an exemplary circuit application of the mounting arrangement of the invention in electrical apparatus; and FIG. 7 is a schematic circuit arrangement of the electrical apparatus shown in FIG. 6.

Referring now more particularly to FIGS. 1 and 2 of the drawings, the electrically isolating mounting arrangement 10 thereof includes a support member, which can be an equipment chassis or a panel structure, depicted generally at 12. For optimum heat conductivity and dissipation the support 12 can be formed from a good thermally and electrically conductive material, such as aluminum. The support 12 is adapted to support a number of circuit components (not shown) to which a relatively high potential device 14 is electrically coupled by means of conductor portions 16 and 18. In this example, the electrical device 14 also is a waste heat-producing or power device, although this is not essential to the electrically isolating mounting feature of the invention. The electrical device 14, in this example, can be a waste heat-producing electrical device which is usually mounted on a chassis or panel structure such as that shown in FIG. 1 and 2, and in this example is illustrated in the form of a semiconductor such as a silicon-controlled rectifier.

The semiconductor 14 includes a case 20 therefor, which in this example is internally and electrically connected to the semiconductor junction, in the conventional manner. A threaded mounting stud 22 is secured, in this example, in electrical contact to the case 20 and hence to the aforementioned junction. If desired, an electrical connection can be established between the semiconductor 14 and others of the aforementioned circuit components by means of the electric leads 18 connected directly to the device 14 and the lead 16 connected to one of the plate mounting bolts, for example bolt 32*a*, described below. By insertion through aligned apertures 24 and 26 in the chassis 12 and in a mounting member of suitable configuration such as plate 28, the stud 22 is utilized together with threaded nut 30 to secure the semiconductor device 14 to the mounting plate 28. Alternatively, the lead 16 can be connected to the support or mounting structure for the device 14, such as mounting plate 28' or 56, as shown in FIGS. 3–5.

The mounting plate 28 for the semiconductor or other electrical device 14 is secured in this example to the upperside of the chassis 12 through the use of a plurality of mounting bolts 32, with four such mounting bolts being employed in this example, as better shown in FIG. 1 of the drawings. The bolts 32, together with the mounting plate 28 are electrically isolated or insulated from the chassis 12, in accordance with my invention, by means described hereinafter. A suitably insulated mechanical shield (not shown) can be provided for the exposed mounting plate 28 and device 14, if desired.

The mounting plate 28, which is rather large in area in comparison with the heat-producing device 14 is preferably fabricated from a good thermal conductor such as copper or aluminum. In any event, however, the material selected for fabrication of the mounting plate 28 will govern the size thereof. The heat-producing device 14 is mounted in good heat transfer relationship with the mounting plate 28, as by closely fitted engagement of the lower end of its casing, i.e., the stud heat 20, with the adjacent surface of the mounting plate 28, as is denoted by reference character 34. This closely fitted engagement is maintained throughout the operating life of the device 14 by means of the threaded stud 22 and nut 30 or other suitable fastening means. The area of the contacting surfaces of the device 14 and mounting plate 28 are critical in that the sizes of the stud 22, stud head 35 and nut 30 must be adequate to transfer the waste heat and to prevent the device 14 from reaching a temperature which is substantially higher than that of the mounting plate 28. In order to secure proper heat conduction a thorough metal-to-metal contact between the device 14 and plate 28 is required. This can be assured by specifying the application of a minimum torque to the stud nut 30. The torque will, of course, vary with the particular device 14 utilized. Desirably, a thermal compound, similar to that described below at 43, is inserted between the device 14 and plate 28 to ensure maximum heat transfer. The base opening 24 is sufficiently large to accommodate the device stud 22 and nut 30 with electrical contact with the base. Desirably, the stud and nut 22, 30 do not physically engage the chassis or base 12, although insulated, to avoid warpage of either the plate 28 or base 12 and loss of thermal contact therebetween, when the nut 30 is tightened.

With this arrangement, the heat dissipated by the device to its casing 20 is rapidly transferred to the mounting plate 28, which is secured in good thermal contact therewith. The mounting plate can be provided with any convenient shape and size, within the area limitations established by the quantity of heat to be transferred, and corresponding with the spatial limitations imposed by the chassis structure 12 and by other circuit components mounted thereon. Owing to the rapid transfer of heat, through the mounting plate 28 by conduction, the mounting member need not be symmetrical about the heat-producing device 14. In certain cases, the mounting member can be fabricated or formed integrally with the device which is to be so mounted for cooling and electrically insulating purposes.

The area covered by the mounting plate 28 is determined by the power rating and corresponding heat dissipation of the power device 14. For example, for a semiconductor power package having a rating of about 15 kilowatts a mounting plate area beyond an optimum area of 15 square inches does not significantly increase the total rate of heat transfer, as the differential temperature across the film 36 begins to decrease in proportion to any increase in plate area beyond the aforementioned area. The mounting member and the heat sink or chassis or other support portion associated therewith need not be planar so long as the juxtaposed surfaces thereof or the opposed surfaces of the coating or film inserted therebetween, are complementarily shaped for contiguous and closely fitted engagement therebetween. The mounting member can be of substantially uniform thickness throughout its area, as it is not necessary, as one of the unexpected results of the invention, to affix convecting fins or other cooling means to the mounting member 25 or to the chassis 12.

In the modification illustrated in FIGS. 1 and 2, the mounting plate 28 is electrically isolated from the chassis 12 by applying a relatively thin electrically insulating film or coating 36 to the chassis 12 at least in the area of the mounting plate 28. Desirably, however, the entire area on both sides of the chassis 12 is so coated and also the stud aperture 24 and mounting apertures 38 through which the mounting plate bolts 32 are inserted. With this arrangement the chassis 12 is simultaneously prepared for electrical insulation from not only the mounting plate 28 but also the hardware associated therewith and with the power dissipating device 14.

Moreover, as an additional precaution, the chassis 12 is electrically insulated by its contiguous coating 36 at the areas of its engagement with a conductive external console panel or other support denoted generally by the reference character 39. As better shown in FIG. 2 of the drawings, the chassis to panel mounting bolts 40 are insulated from the chassis 12 by means of coating portions 36*a* coated upon aperture walls 42 and by coating portion 36*b* underlying the washer and bolt head of each mounting bolt 40. In like manner, the power device stud 22 and bolts 32 of the mounting plate 28 are electrically insulated from their respective apertures 24 and 38.

Virtually all electrically insulating materials of high dielectric constant, however, have a corresponding, relatively low coefficient of heat transfer. This holds true, of course, for a unit area of the coating 36, and this effect is compensated in my mounting arrangement by providing a relatively large area of closely fitted engagement between the mounting plate 28 and the chassis 12 to which the heat is transferred and which acts as a heat sink for the mounting plate 28. This large hat transfer area results in an unexpectedly low thermal drop across the coating 36. In this arrangement, although the unit thermal impedance of the coating 36 is undesirably high, a considerable quantity of heat can be transferred thereacross by a substantially simultaneous application of a very low thermal differential because of rapid heat transfer longitudinally through the conductive plate material, across a considerable area of the coating. The size of the area, moreover, enables a large quantity of heat to be transferred at a relatively low thermal differential. Accordingly, the device 14 can be operated at a correspondingly lesser temperature. The relatively large heat transfer area of that portion of the coating or film 36, which is interposed between the mounting plate 28 and the chassis 12, produces a correspondingly lower total thermal impedance.

The chassis or base 12 is sized so that substantially all of the heat transferred thereto by the one or more mounting plates (FIG. 6) is dissipated directly from both sides of the base 12 by radiation or convection, or a combination of these phenomena. If necessary the areas of the sidewalls 45 or 45′ (FIG. 2 or 5) and/or the mounting flanges 12*a* or 106 (FIG. 2 or 6) can be increased where additional heat must be dissipated from the base 12. The height of the sidewalls desirably provides an air space 47 beneath the base 12, not only for the various items of mounting hardware, but also for the free flow of air for convectional cooling. For this purpose, both sides of the base are open as better shown in FIG. 6.

In certain applications, the console panel 39 or the like can serve as an added heat sink for the insulated chassis or base 12 and in turn for the mounting plate 28 by providing a large surface area of contiguous contact between the panel 39 and the one or more coated mounting flanges 12*a* (or 106, FIG. 6) of the chassis 12. The contacting surfaces of the flanges 12*a* or 106 can be made contiguous (with thermal grease) for maximum heat transfer, as noted above. In most applications, however, the chassis 12 itself is sized to provide sufficient heat dissipation for the heat transferred to the chassis by one or more devices 14. Assuming that only the console panel or other support or enclosure 39 can be contacted by operating personnel, it will be seen that all shock hazard is eliminated, as there must be a double insulation failure—both at the mounting plate 28 and at the chassis mounting flange 12*a*before the mounting plate potential can be applied to the panel or enclosure 39.

In accordance with one method for applying a very thin coating 36 to the chassis 12, a quantity of pulverulent or finely divided electrically insulating material, for example an epoxy resin, is suspended in an air bath the velocity of which is controlled to fluidize the particulate material in accordance with known fluidization techniques. The suspended solid particles therefore exhibit the properties of a "dry" fluid. The workpiece to be coated such as the chassis 12 or 12′ (FIG. 1 or 5) or the mounting plate 28′ (FIGS. 3 and 4) is preheated to the melting temperature of the resin and then immersed in the fluidized particles. The preheated metal workpiece will then cause the finely divided particles to melt slightly and to adhere to the metal surfaces, including the aforementioned aperture walls, in a virtually inseparable bond. A relatively thin coating in the order of 10 mils or less is thereby formed. The particle size of the fluidized material is made as small as practical to produce a smooth coating with little or no ripple. In this way a thinner coating (with improved electrical and thinned properties) can be used. A smoother coating results, of course, in a more contiguous contact between the mounting plate 26 and base 12.

When the coating thickness is controlled as aforedescribed, an extremely high voltage insulation barrier as well as an extremely tough coating surface is provided. On the other hand the thinness of the coating and the depositional character thereof affords an unexpectedly high unit heat transfer rate. (It is contemplated of course, that equivalent coating materials and other coating methods such as a very finely divided spray, vapor deposition, etc. can be utilized depending upon the application of the invention and the quantity of heat to be dissipated in a given application.) Desirably, a coating 36 should be selected having a medium to dark, matte finish to improve heat dissipation from the chassis 12' by radiation in order to enhance the value of the chassis 12' as a heat sink. By coating the various apertures associated with the mounting bolts 32 and 40 and with the mounting stud 22, insulating washers and bushings are eliminated along with time and material expenditures associated therewith.

Before the mounting plate 28 is secured to the chassis 12, a layer 43 of a thermal compound of known composition including a grease and graphite dispersion or a silicone grease (such as available from Dow Corning Corporation, Midland, Michigan) can be applied to one of the engaging areas thereof, for example to the adjacent side of the mounting plate. This, in effect, provides a completely contiguous contact between the mounting plate and the coating film, when the latter is deposited upon the chassis 12 as shown in FIGS. 1 and 2, and compensates for any surface irregularities that may occur in the coating in its as-deposited condition. The coating can, of course, be lightly ground or otherwise smoothed to assure a uniformly smooth contour. Alternatively, heat can be applied to either the mounting plate 28 or the chassis 12 or both to melt at least a portion of the interposed coating or coatings and thereby to ensure a completely contiguous contact between the coating material and the juxtaposed surfaces respectively of the mounting plate and chassis. In many applications it is feasible to dispense with the fastening hardware for the mounting plate 28 and simply glue the plate 28 onto the chassis by partially or completely melting an insulating coating previously deposited thereon or by depositing a small quantity of an air-setting epoxy adhesive or the like centrally of one or both of the juxtaposed plate and chassis surfaces and pressing these parts together.

Referring now successively to FIGS. 3 to 5 of the drawings, alternative arrangements of my mounting and heat-dissipating arrangements are disclosed therein. In the latter figures similar reference characters with primed accents are employed to denote similar components of FIGS. 1 and 2. In FIG. 3 of the drawings, the mounting plate 28', desirably with the power dissipating device 14' secured thereto in electrically and thermally conductive relationship, is provided on both sides with a film or coating 44 prior to assembly to the chassis 12'. The mounting bolt apertures 46 of the mounting plate 28', are likewise and simultaneously provided with coating portions **44*a* in the manner and for the purpose as described above in connection with FIGS. 1 and 2 of the drawings. Suitable fastening means, such as machine screws 48, are inserted through suitably disposed registering apertures 49 in the chassis 14' and through coated apertures 46 of the mounting plate 28'**.

A registering opening 24' can be provided in the chassis 12' to insulate the power-dissipating device 14' and particularly its stud 22' from the chassis 12'. The area of the mounting plate adjacent the stud aperture 52 desirably is masked before coating the mounting plate 28', so that the electrically and thermally conductive engagement of the waste heat-producing device 14' with the adjacent surfaces of the mounting plate 28' as denoted by reference characters 34' can be made without removal of coating from this area. Accordingly, the case lead or conductor 16' can be electrically connected to the mounting plate 28' by suitable terminal means 54, if desired. More importantly, the heat to be dissipated flows from the casing 20' to the mounting plate 28' from which it is readily transfered across the intervening insulating plate coating or film 44 to the chassis 12' in the same manner as that described in connection with the coating 36 of FIGS. 1 and 2. A thermal grease can be used to ensure maximum heat transfer.

The chassis 12', which accordingly can serve as the entire heat sink for the power dissipating device or devices 12', is however, electrically isolated from the mounting plate 28' and the power device 14' with the result that the possibility of shock hazard relative to the chassis 12' is greatly reduced. For further protection, however, the chassis 12' can be electrically isolated from the console panel or other support, for example, by providing an insulating coating or film at the junction therebetween, for example, in the manner described above in connection with FIGS. 1 and 2 and the junction between chassis mounting flange **12*a* and the support 39. The aforementioned thermal compound mentioned above with reference to FIGS. 1 and 2** likewise can be used, if desired.

A somewhat similar arrangement is illustrated in FIG. 4 of the drawings wherein, depending upon the coating material utilized, both the mounting plate 28' and the chassis 12' are provided with coatings 44' and 36' respectively. The arrangement in FIG. 4 is useful in those applications wherein additional electrical insulation is required between the plate 28' or where it is desired to insulate also the plate 28' against personnel contact or, generally where very thin coatings, very high voltages, or coatings with inferior dielectric constants may be employed.

In the arrangement of FIG. 5 a folded mounting member 56 is provided and is exemplarily mounted on the underside of a coated chassis structure 12'. The waste heat-producing device 14' in this arrangement is mounted upon channel portion 60 of the mounting member 56, the height and width of which channel portion accommodate the mounting stud and nut 22', 30' of the device 14' and provide the necessary access thereto for removal and replacement of the device 14'. Owing to the excellent heat conductive properties of the mounting member 56, which can be fabricated from one of the materials mentioned above in connection with FIGS. 1 and 2 of the drawings, and owing to the contiguous engagement of its flanges 62 with the chassis 12, the member 56 readily dissipates heat thereto in the manner described above with reference to the preceding figures. Depending upon the application of the invention and the extent of electrical isolation required, it is contemplated that either or both of the mounting member 56 and the chassis 12' can be coated for electrical insulation, as set forth in the description of FIGS. 1 to 4, or alternatively, in the case of the mounting member 56, at least the outer surfaces thereof can be blackened or otherwise coated to promote radiational heat transfer where temperature conditions permit.

In the arrangement as shown in FIG. 5 the use of the channeled portion 60 to mount the device 14' also permits the device 14' to be completely and electrically isolated from the upper surface of the chassis 12', to further reduce shock hazard in certain applications where the chassis 12' may be mounted so that its upper surface is exposed to personnel contact. In furtherance of this purpose the heads 64 of the mounting screws 32' can be spot-coated (not shown) after the chassis 12' and mounting member 56 are assembled to obviate personnel contact and shock hazard. Desirably, opening 68 and the channel portion 60 extends completely across the mounting plate 56 so that access to the mounting means 22', 30' of the device 14' can be had from either side of the plate 56. The mounting member opening 68, of course, communicates with the air space 47' beneath the base 12' for connectional purposes. Depending upon the number of electrical devices to be mounted upon the plate 56, additional folds or channels, (not shown) similar to channel 60 for this example, can be formed in the mounting member 56.

For higher rated power devices 14'', the arrangement of FIG. 5A can be used with any of the preceding mounting and cooling systems. In FIG. 5A, a substantially thicker mounting plate 28'' is employed for an improved, overall heat transfer characteristic. The mounting plate 28'' otherwise can be fabricated and joined to the base 12'' as described above. The use of a thicker mounting plate increases the rate of thermal transfer along the length and width of the mounting plate and results in a more nearly uniform temperature gradient over the plate area. By the same token, a more uniform temperature differential attains across that entire portion of the base coating 36'' which lies between the mounting plate 28'' and the chassis or base 12''. The necessarily greater quantity of heat dissipated by the device 14'', therefore, is transferred more efficiently to the insulated heat sink or base 12''. In consequence the operating temperature of the higher rated device 14'' is unexpectedly lowered.

Referring now to FIGS. 6 and 7 of the drawings, an exemplary application of the invention is illustrated as used in a solid state proportional power controller.

The circuit arrangement 70 of the controller is shown pictorally in FIG. 6, with parts being removed in order to show the invention more clearly. The circuit arrangement 70 is shown in somewhat greater detail schematically in FIG. 7, where similar reference characters with primed accents denote similar components of FIG. 6. In this example, the circuit arrangement 70 includes a SCR driver or magnetic amplifier 74 and associated components. Only those circuit connections relating to the mounting includes a SCR driver or magnetic amplifier arrangement of the invention are illustrated in FIG. 6 of the drawings.

A pair of SCR's 76, 77 mounted respectively on mounting plates 78 and 78*a* by means of their anode studs are coupled through their gates, as better shown in FIG. 7, to the SCR driver 74 through conductors 80. The mounting plates 78 and 78*a* are secured to chassis structure 82, as set forth above in connection with any of the preceding figures, for example, as arranged in FIGS. 1 and 2. The chassis 82 is coated on both sides thereof for the purposes noted above while the mounting plates 78 and 78*a* together with mounting plate 84 are left uncoated.

A pair of power diodes 86 and 87 are mounted respectively on the smaller mounting plate 84, which is otherwise secured to the chassis 82 in the manner described previously with reference to the SCR mounting plates, and on one of the SCR plates 78*a* adjacent the associated SCR 76 or 77. In this example, diode 87 is a reverse diode having an anode mounting stud. The diodes 86 and 87 dissipate proportionally less heat than the SCR's 76, 77 and therefore require less mounting plate area. Thus, the mounting plate 84 can be of proportionally less area, as shown in FIG. 6. Similarly, mounting plate 78 having a single power dissipating device SCR 76, thereon is of an intermediate area. If desired, however, for manufacturing uniformity, all of the plates 78, 78*a* and 84 can be of the same size and shape as the largest plate 78*a*.

The current through the SCR's 76, 77 is limited by connecting their cathodes respectively through a pair of current limiting fuses 88 of known construction. As better shown in FIG. 6, this connection is made simply by joining the appropriate terminals of the fuses 88 respectively to the mounting plates 78 and 84 which in turn are electrically connected respectively to line conductors 90 and 92. The fuses 88, as better shown in FIG. 7, form barriers for excessive current surges which may be supplied to the SCR's from input terminals 94. The fuses, therefore, are prevented from overheating unnecessarily by transfer of heat to the mounting plates 78, 84 through the associated fuse straps 89. A premature self-destruct (a common problem) of the fuses 88 is thereby avoided. The anode and cathode respectively of the diodes 86 and 87 are interconnected by the branched portions of line conductor 92.

The mounting plates 78 and 84 also can be utilized as terminal means for making other circuit connections. For example, the anodes of the SCR's 76, 77 and diode 87 and the cathode of diode 86 are connection to the SCR driver 74 by means of conductors 96 which are joined respectively to one mounting fastener of each of the mounting plates 78, 78*a*, 84. Similarly, the fuses 88 are joined respectively to the SCR mounting plate 78 and to the diode mounting plate 84 by means of one of the aforementioned fasteners. Other circuit connections of the circuit arrangement 70 are illustrated in greater detail in FIG. 7 of the drawings. For example an external load device denoted schematically at 98 is connected to output terminals 100, which in turn are connected through conductors 102 and 104 to the diode-SCR mounting plate 78*a* and to the diode plate 84, respectively.

With the circuit arrangement as shown in FIG. 6, the SCR and diode mounting plates 78, 78*a*, and 84 serve not only as mounting, cooling and electrical isolating means for the associated SCR's 76, 77, the diodes 86 and 87 and the fuses 88 but also provide convenient means for making input and output connections to the circuit and for making various circuit interconnections, particularly for the relatively heavy mounting straps of the fuses 88, with the use of a minimum of mounting and terminal hardware. It is also to be noted that all of the circuit components together with the wiring interconnections therebetween are mounted on the top surface of the chassis heat sink 82, as shown in FIG. 6, for ready access thereto for assembly, maintenance and replacement of such components. The chassis 82 can, of course, be mounted within or on a console or other support (not shown) as noted above in connection with FIGS. 1 and 2 of the drawings.

The chassis 82 when provided on both sides with the insulating coating described above is capable of dissipating all of the heat rapidly transferred thereto from the mounting plates 78, 78*a* and 84. In those applications requiring additional heat dissipation, as where additional mounting and cooling plates (not shown) are secured thereto, the area of the chassis or base 82 can be correspondingly increased by increasing the height of wall sections 105 and/or the width of the mounting flanges 106. Alternatively, the base flanges 106 can be secured in a completely contiguous engagement with a console panel or other external sink for additional heat dissipation, as mentioned above in connection with FIGS. 1, 2 and 5 of the drawings.

From the foregoing it will be apparent that novel and efficient forms of mounting and cooling means for power or waste heat-producing devices are disclosed herein. While I have shown and described certain presently preferred embodiments of the invention and have illustrated certain presently preferred methods of practicing the same, it is to be distinctly understood that the invention is not limited thereto, but may be otherwise variously embodied and practiced within the scope of the following claims.

I claim:

1. A mounting and cooling arrangement comprising a number of circuit components including at least one heat-producing electrical device, an electrically conductive mounting member, means for securing said device to said mounting member in thermally and electrically conductive relation, a base structure supporting said components, said structure including a supporting portion for said mounting member, said supporting portion being shaped complementarily with a juxtaposed surface of said mounting member and coextending therewith, the area of said juxtaposed surface being several times larger than that area of the device which is contacted by said mounting member, a thin electrically insulating coating interposed between and substantially coextending with said mounting member surface and said supporting portion, said coating being adhered to at least one of said mounting member surface and said supporting portion, said mounting member surface and said supporting portion being sized to obtain a low overall thermal impedance therebetween and to dissipate heat across said coating at a relatively low-temperature differential between said mounting member and said supporting portion, said base structure being sized to dissipate substantially all of the heat transferred thereto without the use of auxiliary cooling means, a fuse element electrically connected between said device and another of said components, said fuse element having a relatively heavy strap flushly engaged with said mounting member for transferring heat from said fuse element to said mounting member to obviate premature self-destruct of said fuse element.

2. A mounting and cooling arrangement comprising a number of circuit components including at least one heat-producing electrical device, an electrically conductive mounting member having a substantially uniform thickness, means for securing said device to said mounting member in thermally and electrically conductive relation, said securing means including means for establishing a compressive metal-to-metal contact between said device and said mounting member in avoidance of any appreciable thermal drop therebetween, a base structure of substantially uniform thickness supporting said components, said structure including a supporting portion for said mounting member, said metal-to-metal contact means being spaced from said supporting portion and being disposed to avoid warpage of said mounting member and of said base structure, said supporting portion being shaped complementarily with a juxtaposed surface of said mounting member and at least coextending therewith, the area of said juxtaposed surface being several times larger than the adjacent area of said device, a thin electrically insulating coating interposed between and substantially coextending with said mounting member surface and the adjacent surface of said supporting portion, said thin coating being closely fitted against said mounting surface and said supporting portion surface and being adhered to at least one of said surfaces, an additional coating completely covering the remaining exposed surfaces of said base structure so that all surfaces of said base structure are completely and electrically isolated, said thin coating having a substantially high thermal and electrical unit impedance, said mounting member and said supporting portion being extended in generally parallel relation to an extent sufficient to obtain a low overall thermal impedance therebetween and to dissipate heat across said coating at a relatively low-temperature differential between said mounting member and said supporting portion, and said base structure being extended in directions substantially parallel to said mounting member to dissipate substantially all of the heat transferred to said base structure without the use of auxiliary cooling or heat-dissipating means.

3. The combination according to claim 2 wherein at least said additional coating is medium to dark in color and of a matte finish to facilitate radiational heat transfer from the remaining portions of said supporting structure.

4. The combination according to claim 2 wherein said coating is adhesive and resilient upon initial engagement of said mounting member with said supporting portion so that said mounting member is adhered to said supporting portion in completely contiguous relation.